US010573986B2

(12) United States Patent
Linde

(10) Patent No.: US 10,573,986 B2
(45) Date of Patent: Feb. 25, 2020

(54) CASING FOR CONNECTING ELECTRICAL LINES PRINTED ON A FOIL TO A VOLTAGE SUPPLY

(71) Applicant: Airbus Operations GmbH, Hamburg (DE)

(72) Inventor: Peter Linde, Hamburg (DE)

(73) Assignee: AIRBUS OPERATIONS GMBH, Hamburg (DE)

(*) Notice: Subject to any disclaimer, the term of this patent is extended or adjusted under 35 U.S.C. 154(b) by 0 days.

(21) Appl. No.: 16/173,183

(22) Filed: Oct. 29, 2018

(65) Prior Publication Data

US 2019/0131732 A1  May 2, 2019

(30) Foreign Application Priority Data

Oct. 30, 2017 (DE) .................. 10 2017 219 437

(51) Int. Cl.
*H01R 12/77* (2011.01)
*H01R 12/89* (2011.01)
(Continued)

(52) U.S. Cl.
CPC .......... *H01R 12/771* (2013.01); *H01R 12/89* (2013.01); *H01R 13/6675* (2013.01); *H01R 25/162* (2013.01); *H05K 5/0221* (2013.01)

(58) Field of Classification Search
CPC ............ H01R 23/6846; H01R 23/6833; H01R 23/6826; H01R 12/87; H01R 12/89;
(Continued)

(56) References Cited

U.S. PATENT DOCUMENTS 4,236,667 A * 12/1980 Crowley ................ G06K 7/045
  235/443
4,684,194 A *  8/1987 Jenkins .................. H01R 12/89
  439/260

(Continued)

FOREIGN PATENT DOCUMENTS

DE  102005002901 A1   7/2006
DE  102013103074 A1  11/2013
FR      1174063 A    3/1959

OTHER PUBLICATIONS

German Search Report; priority document.

*Primary Examiner* — Gary F Paumen
(74) *Attorney, Agent, or Firm* — Greer, Burns & Crain, Ltd.

(57) ABSTRACT

A casing for connecting electrical lines printed on a foil to a voltage supply. The casing comprises a space, terminal pads and a block. The casing has an opening between a first wall of the space and a first outer side of the casing. The terminal pads are at least partially arranged on a second outer side of the casing. The block is configured to move between a first position and a second position, both within the space. The block is configured to press the foil against a second wall of the space when the block is in the first position. The block is configured to establish an electrical connection between the electrical lines printed on the foil and the terminal pads when the block is in the first position. The space is configured to receive the foil through the opening when the block is in the second position.

14 Claims, 11 Drawing Sheets

(51) Int. Cl.
  *H01R 13/66* (2006.01)
  *H01R 25/16* (2006.01)
  *H05K 5/02* (2006.01)

(58) Field of Classification Search
  CPC .................. H01R 12/771; H01R 13/6675;
   H01R 25/162; H05K 5/0221
  USPC ........................................................ 439/260
  See application file for complete search history.

(56) References Cited

U.S. PATENT DOCUMENTS

| | | | | |
|---|---|---|---|---|
| 5,816,845 | A * | 10/1998 | Chishima | H01R 12/79 439/495 |
| 7,025,613 | B2 * | 4/2006 | Satou | H01R 12/79 439/260 |
| 2001/0010980 | A1 * | 8/2001 | Matsumura | H01R 12/87 439/267 |
| 2006/0030205 | A1 | 2/2006 | Zhang et al. | |
| 2013/0303029 | A1 * | 11/2013 | Chen | H01R 24/62 439/630 |

* cited by examiner

CASING FOR CONNECTING ELECTRICAL LINES PRINTED ON A FOIL TO A VOLTAGE SUPPLY

This application claims the benefit of German patent application No. 10 2017 219 437.5 filed on Oct. 30, 2017, the entire disclosures of which are incorporated herein by way of reference.

BACKGROUND OF THE INVENTION

Examples relate to concepts for connecting electrical lines printed on a foil to a voltage supply and applications in this respect, and in particular to a casing for connecting electrical lines printed on a foil to a voltage supply, a method for connecting a foil provided with printed electrical lines to a casing, a foil provided with printed electrical lines, a voltage supply and a method for connecting a voltage supply to a casing.

Casings must be optimized as much as possible with regard to reducing the number of power cables. Nevertheless, an easier connection possibility for lines printed on foils is desired.

There may be a need for providing concepts for casings with an easier connection possibility.

SUMMARY OF THE INVENTION

According to a first aspect, a casing for connecting electrical lines printed on a foil to a voltage supply is provided. The casing comprises a space, terminal pads and a (first) block. The casing has an opening between a first wall of the space and a first outer side of the casing. The terminal pads are at least partially arranged on a second outer side of the casing. The block is configured to move (for example, only) between a first position within the space and a second position within the space. The block is configured to press the foil against a second wall of the space when the block is in the first position. The block is configured to establish an electrical connection between the electrical lines printed on the foil and the (corresponding terminal pads of the) terminal pads when the block is in the first position. The space is configured to receive the foil through the opening when the block is in the second position.

The space may be defined by six walls, where the space may have a first, second, third, fourth, fifth and sixth wall. The space may be a hollow space, a cavity or a hollow space. The space may be a space inside the casing. The space may be connected (for example only) via the opening to an outer side of the casing. The space may represent or be a volume inside the casing.

The terminal pads may be intended for being connected to the voltage supply.

The foil may, for example, be flexible.

The electrical connection between the electrical lines printed on the foil and the terminal pads may, for example, be an electrical connection between two electrical lines of the electrical lines printed on the foil and two terminal pads corresponding thereto with the terminal pads. For example, the electrical connection may be a potential difference (voltage) (between two corresponding terminal pads, for example between a potential and an earth or ground). This potential difference may then be transferred (via the electrical connection), for example by way of voltage conversion, to two corresponding conductors of the foil. The electrical connection may comprise a voltage transmission or a voltage conversion between the terminal pads and the (corresponding) electrical lines.

Here, the expression "electrical connection" should be understood as meaning that a voltage transformer may be interposed.

The opening may be a connection between the space and the first outer side of the casing. The space may be located inside a volume of the casing. The second outer side may differ from the first outer side. The second outer side may be referred to as an upper side of the casing and the first outer side may be referred to as a lateral outer side of the casing. The foil can be (manually) inserted up to an end of the space. The first position may be located between the end of the space and the second position. The end of the space may be the sixth wall.

The opening may be slit-shaped. The slit-shaped opening may be made of such a size that the foil provided with printed electrical lines can be led through. The foil provided with printed electrical lines may be able to be led (be led) through the slit-shaped opening.

The casing may comprise a voltage transformer. The voltage transformer may be connected between the terminal pads and the block. The voltage transformer may be configured to transform a first voltage, applied to the terminal pad, to a second voltage, applied to the block, in order to establish the electrical connection between the electrical lines printed on the foil and the terminal pads.

The block may have electrical terminals. The electrical terminals may be configured to connect the electrical lines printed on the foil to the voltage transformer.

The first voltage may be (two times and/or three times) greater than the second voltage. The first voltage may be 270 volts and the second voltage may be 115 volts or 28 volts.

The voltage transformer may be located outside (a volume of) the space. The voltage transformer may be located inside (a volume of) the casing.

The terminal pads may be configured to establish an electrical connection between the voltage transformer and the voltage supply.

The first position and the second position may be located on a third wall (inclined plane) of the space. The third wall may lie opposite the second wall. The first and third walls of the space may include (have) an angle of less than 80°. The third wall may run askew to the second wall. The first outer side and the second outer side may adjoin one another. The first outer side and the first wall may be substantially parallel (coplanar).

The first position and the second position may be located between the first and sixth walls.

The third wall may touch the second wall. Furthermore, an opening of the space may be located between the second and third walls. A cable that is connected to the block in order to establish the electrical connection may lead from the voltage transformer into the space.

The casing may also comprise a second block and a third block. The first block may be located between the second and third blocks. The second block and the third block may be configured to move between the second and third positions. The second block and the third block may be configured to press the foil against the second wall when the second and third blocks are in the third position. The third position may be located between the first and second positions.

The casing may also comprise a multiplicity of springs. A respective end of each spring of the multiplicity of springs may be attached to the first wall of the space. Each of the multiplicity of springs may be configured to press the first block (away) (from the first wall of the space) into the first position (along the third wall).

The casing may also comprise a first and a second spring. The first spring may be configured to connect the second block to the first wall. One end of the first spring may be attached to the first wall. The first spring may be configured to press the second block (away) (from the first wall of the space) into the third position (along the third wall). The second spring may be configured to connect the third block to the first wall. One end of the second spring may be attached to the first wall. The second spring may be configured to press the third block (away) (from the first wall of the space) into the third position (along the third wall).

The first block may be located alongside the second and third blocks on the third wall. The first block may adjoin the second block. The first block may adjoin the third block. The first, second and third blocks may be located between a fourth and a fifth wall of the space. The first, second and third blocks may be located on the third wall. The fourth and fifth walls may adjoin the first, second and third walls of the space. The space may taper in a direction away from the first wall of the space. The fourth and fifth walls of the space may be substantially parallel.

A surface area of the fourth wall may substantially coincide with a surface area of the fifth wall.

A form of the first block may differ from a form of the second or third block. A portion of the (first, second or third) block that touches the foil may be flattened in order to minimize pressure on the foil.

The first spring may be arranged on one side alongside the multiplicity of springs. The second spring may be arranged on another side alongside the multiplicity of springs.

The multiplicity of springs may be located between the first spring and the second spring.

The casing may also comprise a release handle. The release handle may be connected to the first block. The release handle may be configured to move the first block from the first position to the second position by the manual application of force. The release handle may be configured to move the first block from the first position into the third position. The release handle may be configured to move the second block and the third block together with the first block from the third position to the second position.

The second and third blocks may respectively have a form closure. The form closure may be respectively configured to receive the first block, in order that the first, second and third blocks can move together from the third position to the first position (when the release handle is actuated).

The release handle may be configured to connect the first block to a third outer side of the casing.

The release handle may be configured to displace the first block (at least partially in the direction of the first wall and/or at least partially along the third wall) when the release handle is manually actuated.

The first block may be configured to move between the second and third blocks on the third wall.

According to a second aspect, a method for connecting a foil provided with printed electrical lines to a casing according to the first aspect is provided. The method comprises moving the release handle from the first position to the second position. The method also comprises inserting the foil into the opening. The method further comprises letting go of the release handle.

According to a third aspect, a foil provided with printed electrical lines is provided. The foil is configured to be connected to a casing according to the first aspect.

According to a fourth aspect, a voltage supply is provided. The voltage supply is configured to be connected to the casing according to the first aspect.

The casing may be configured to establish a connection between the voltage supply and the electrical lines of the foil.

The voltage supply may be provided in the form of a bus system.

According to a fifth aspect, a method for connecting the voltage supply according to the fourth aspect to the casing according to the first aspect is provided.

It is clear to a person skilled in the art that the explanations set out herein may be implemented by using hardware circuits, software means or a combination thereof. The software means may be in conjunction with programmed microprocessors or a general computer, an ASIC (Application Specific Integrated Circuit) and/or DSPs (Digital Signal Processors). For example, the voltage supply, the voltage transformer, the casing, the foil may partially be realized as a computer, a logic circuit, an FPGA (Field Programmable Gate Array), a processor (for example comprising a microprocessor, a microcontroller (μC) or a vector processor)/core (main memory, may be integrated in the processor or used by the processor)/CPU (Central Processing Unit; where a number of processor cores are possible), an FPU (Floating Point Unit), an NPU (Numeric Processing Unit), an ALU (Arithmetic Logical Unit), a coprocessor (additional microprocessor to support a main processor (CPU)), a GPGPU (General Purpose Computation on Graphics Processing Unit), a parallel computer (for simultaneously executing computing operations, including on multiple main processors and/or graphics processors) or a DSP. It is clear to a person skilled in the art that even whenever details described herein are described with reference to a method, these details may also be realized in a suitable device, a computer processor or a memory connected to a processor, the memory being provided with one or more programs that carry out the method when they are executed by the processor. This may involve using methods such as swapping and paging.

Even if some of the aspects described above have been described with reference to the method, these aspects may also apply to the casing or the voltage supply. Equally, the aspects described above with reference to the casing may apply in a corresponding way to the method. Equally, the aspects described above with reference to the voltage supply may apply in a corresponding way to the casing or the method.

It likewise goes without saying that the terms used here merely serve for describing individual embodiments and are not to be considered as restrictive. Unless otherwise defined, all of the technical and scientific terms used here have the meaning corresponding to the general understanding of a person skilled in the art in the specialist field relevant for the present disclosure; they must not be interpreted too widely or too narrowly. If specialist terms are used inaccurately here, and therefore do not express the technical concept of the present disclosure, they should be replaced by specialist terms that impart a correct understanding to a person skilled in the art. The general terms used here should be interpreted on the basis of the dictionary definition or in accordance with the context; when so doing, an interpretation that is too narrow should be avoided.

It should be understood here that terms such as for example "comprise" or "have" etc. mean the presence of the described features, numbers, operations, actions, components, parts or combinations thereof and do not exclude the presence or the possible addition of one or more further features, numbers, operations, actions, components, parts or combinations thereof.

Although terms such as "first" or "second," etc. are possibly used for describing various components, these components should not be restricted to these terms. With the above terms it is merely intended to distinguish one component from the others. For example, a first component may be referred to as a second component without departing from the scope of protection of the present disclosure; similarly, a second component may be referred to as a first component. The term "and/or" comprises both the combination of the multiple items linked to one another and each item of this plurality of the plurality of items described.

If it says here that a component "is connected" to, consequently "is in connection" with or "accesses," another component, this may mean that it is directly connected to it or directly accesses it; however, it should be noted here that a further component may lie in between. If, on the other hand, it says here that a component is "directly connected" to or "directly accesses" another component, this should be understood as meaning that there are no further components in between.

There follows a description of the preferred embodiments of the present disclosure with reference to the accompanying drawings; identical components are always provided here with the same designations. In the description of the present disclosure, detailed explanations of known associated functions or constructions are not given if they unnecessarily distract from the sense of the present disclosure; such functions and constructions are however understandable to a person skilled in the art. The accompanying drawings of the present disclosure serve for illustrating the present disclosure and should not be interpreted as restrictive. The technical concept of the present disclosure should be interpreted in such a way as to include not only the accompanying drawings but also all such modifications, changes and variants.

BRIEF DESCRIPTION OF THE DRAWINGS

Further aims, features, advantages and application possibilities emerge from the following description of exemplary embodiments, which are not to be understood as restrictive, with reference to the associated drawings. In these, all of the features described and/or graphically presented show by themselves or in any desired combination the subject matter disclosed here, even independently of how they are grouped together in the claims or the way in which the claims refer back to one another. The dimensions and proportions of the components shown in the figures are not necessarily to scale here; in embodiments to be implemented, they may deviate from what is illustrated here.

DETAILED DESCRIPTION OF THE PREFERRED EMBODIMENTS

Figure 1:
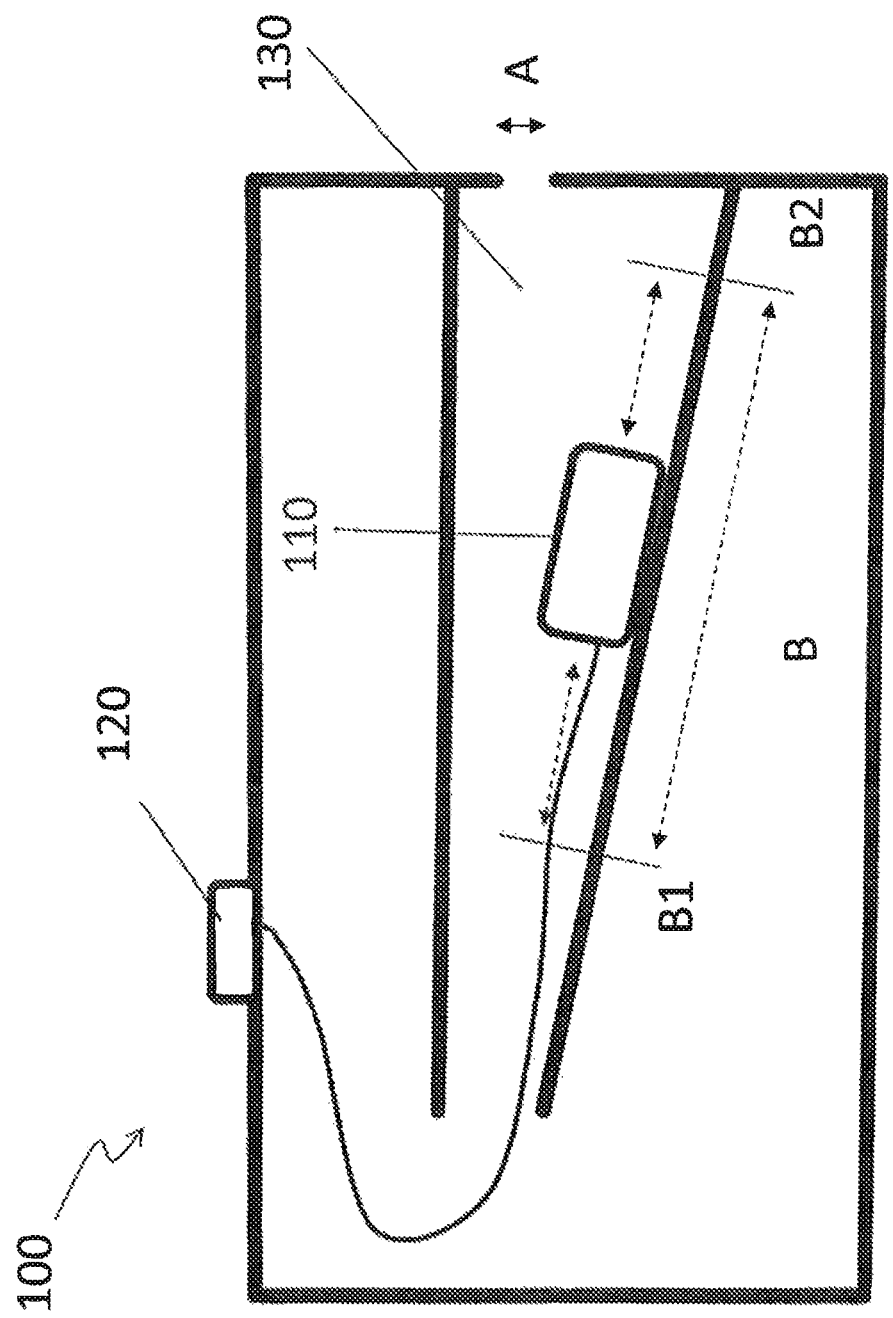
FIG. 1 shows a schematic representation of a casing for connecting electrical lines printed on a foil to a voltage supply.

The method variants described here, and their functional and operational aspects merely serve for better understanding of their structure, functional mode and properties; they do not restrict the disclosure, for instance to the exemplary embodiments. The figures are partially schematic, essential properties and effects sometimes being shown greatly enlarged or reduced in order to illustrate the functions, operating principles, technical configurations and features. At the same time, each functional mode, each principle, each technical configuration and each feature that is disclosed in the figures or in the text can be combined freely and as desired with all the claims, each feature in the text and in the other figures, other functional modes, principles, technical configurations and features that are contained in this disclosure or emerge from it, so that all conceivable combinations can be assigned to the devices described. At the same time, combinations between all individual statements in the text, that is to say in each section of the description, in the claims and also combinations between various variants in the text, in the claims and in the figures are also comprised and can be made the subject of further claims. The claims also do not limit the disclosure, and consequently the possibilities of combination of all the features presented with one another. All of the disclosed features are explicitly also disclosed individually and in combination with all other features here.

The casing, the voltage supply, the methods and the foil are now described on the basis of exemplary embodiments.

Without being restricted thereto, specific details are set out below to provide a complete understanding of the present disclosure. It is however clear to a person skilled in the art that the present disclosure can be used in other exemplary embodiments, which may deviate from the details set out below.

While further examples are accordingly suitable for various modifications and alternative forms, some examples of the same are shown by way of example in the figures and are described in detail here. It goes without saying, however, that it is not intended to limit examples to the specific forms disclosed. Further examples may cover all modifications, equivalents and alternatives that come within the scope of the disclosure. In the entire description of the figures, the same designations relate to the same or similar elements, which can be implemented identically or in a modified form in comparison with one another while they provide the same or a similar functionality.

It goes without saying that, when an element is referred to as "connected" or "coupled" to another element, the elements may be connected or coupled directly or by way of one or more intermediate elements. If two elements A and B are linked by an "or," this should be understood as meaning that all possible combinations are disclosed, i.e., only A, only B and also A and B. An alternative wording for the same combinations is "at least one out of A and B." The same applies to combinations of more than two elements.

The terminology used herein is intended to describe specific examples and not to be restrictive for further examples. Whenever a singular form such as "a, an" and "the" is used, and the use of only one element is neither explicitly nor implicitly defined as obligatory, further examples may also comprise the plural forms to implement the same functionality. In a similar way, if a functionality is described below in such a way that it is implemented by using a number of elements, further examples may implement the same functionality by using a single element or a single processing entity. It also goes without saying that the terms "comprises," "comprising," "have," "contains/includes," "containing/including" and/or "having" are used here to indicate the presence of specified features, whole numbers, steps, operations, elements and/or component parts, but do not rule out the presence or the addition of one or more other features, whole numbers, steps, operations, elements, component parts and/or groups of the same.

Unless otherwise defined, all of the terms used here (including technical and scientific terms) are used in their usual meaning in the field to which the examples belong.

FIG. 1 shows a schematic representation of a casing for connecting electrical lines printed on a foil to a voltage supply. The casing 100 is intended for connecting electrical lines (not shown) printed on a foil to a voltage supply (not shown). The casing 100 comprises a space 130, terminal pads 120 and a (first) block. The casing 100 has an opening A between a first wall of the space and a first outer side of the casing 100. The terminal pads 120 are at least partially arranged on a second outer side of the casing 100. The block 110 is configured to move (for example only) between a first position B1 within the space 130 and a second position B2 within the space 130. The freedom of movement may be described by a range B along a third wall. The block 110 is configured to press the foil against a second wall of the space 130 when the block 110 is in the first position B1. The block 110 is configured to establish an electrical connection between the electrical lines printed on the foil and the (corresponding terminal pads 120 of the) terminal pads 120 when the block 110 is in the first position B1. The space 130 is configured to receive the foil through the opening A when the block 110 is in the second position B2.

For example, the space 130 may be defined by six walls. The space 130 may have a first, second, third, fourth, fifth and sixth wall. The space 130 may be a hollow space, a cavity or a hollow space.

For example, the terminal pads 120 may be intended for being connected to the voltage supply.

For example, the foil is flexible.

For example, the electrical connection between the electrical lines printed on the foil and the terminal pads 120 may for example be an electrical connection between two electrical lines of the electrical lines printed on the foil and two terminal pads 120 corresponding thereto of the terminal pads 120. For example, the electrical connection may be a potential difference (voltage) (between two corresponding terminal pads, for example between a potential and an earth). This potential difference may then be transferred (via the electrical connection), for example by way of voltage conversion, to two corresponding conductors of the foil. The electrical connection may comprise a voltage transmission or a voltage conversion between the terminal pads 120 and the (corresponding) electrical lines.

For example, it may be that the expression "electrical connection" should be understood as meaning that a voltage transformer may be interposed.

For example, the opening A may be a connection between the space 130 and the first outer side of the casing 100. The space 130 may be located inside a volume of the casing 100. The second outer side may differ from the first outer side. The second outer side may be referred to as an upper side of the casing 100 and the first outer side may be referred to as a lateral outer side of the casing. The foil can be (manually) inserted up to an end of the space 130. The first position may be located between the end of the space 130 and the second position. The end of the space 130 may be the sixth wall.

For example, the opening A may be slit-shaped. The slit-shaped opening A may be made of such a size that the foil provided with printed electrical lines can be led through. The foil provided with printed electrical lines may be able to be led (be led) through the slit-shaped opening.

For example, the casing 100 may comprise a voltage transformer. The voltage transformer may be connected between the terminal pads 120 and the block 110. The voltage transformer may be configured to transform a first voltage, applied to the terminal pad, to a second voltage, applied to the block 110, in order to establish the electrical connection between the electrical lines printed on the foil and the terminal pads 120.

For example, the block 110 may have electrical terminals (not shown). The electrical terminals may be configured to connect the electrical lines printed on the foil to the voltage transformer.

For example, the first voltage may be (two times, three times and/or four times) greater than the second voltage. The first voltage may be 270 volts and the second voltage may be 115 volts or 28 volts. The voltage transformer may also be configured to convert the first voltage to the second and a third voltage, for example first voltage 270 volts, second voltage 115 volts and third voltage 28 volts. The first voltage may be eight times, nine times or ten times the third voltage. The second voltage may be applied to corresponding terminals of the block 110. The third voltage may be applied to corresponding terminals of the block 110. The electrical terminals of the block 110 may be connected to the electrical lines of the foil.

For example, the voltage transformer may be located outside (a volume of) the space. The voltage transformer may be located inside (a volume of) the casing 100.

For example, the terminal pads 120 may be configured to establish an electrical connection between the voltage transformer and the voltage supply.

For example, the first position B1 and the second position B2 may be located on a third wall (inclined plane) of the space 130. The third wall may lie opposite the second wall. The first and third walls of the space 130 may include (have) an angle of less than 80°. The third wall may run askew to the second wall. The first outer side and the second outer side may adjoin one another. The first outer side and the first wall may be substantially parallel (coplanar).

For example, the first position B1 and the second position B2 may be located between the first and sixth walls.

For example, the third wall may touch the second wall. Furthermore, an opening of the space 130 may be located between the second and third walls. A cable that is connected to the block 110 in order to establish the electrical connection may lead from the voltage transformer into the space 130.

For example, the casing 100 may also comprise a second block 110' and a third block 110". The first block 110 may be located between the second 110' and third 110" blocks. The second block 110' and the third block 110" may be configured to move between the second and third positions. The second block 110' and the third block 110" may be configured to press the foil against the second wall when the second 110' and third 110" blocks are in the third position. The third position may be located between the first and second positions.

For example, the casing 100 may also comprise a multiplicity of springs. A respective end of each spring of the multiplicity of springs may be attached to the first wall of the space 130. Each of the multiplicity of springs may be configured to press the first block 110 (away) (from the first wall of the space) into the first position (along the third wall).

For example, the casing 100 may also comprise a first and a second spring. The first spring may be configured to connect the second block 110' to the first wall. One end of the first spring may be attached to the first wall. The first spring may be configured to press the second block 110' (away) (from the first wall of the space) into the third position (along the third wall). The second spring may be configured to connect the third block 110" to the first wall. One end of the second spring may be attached to the first wall. The second spring may be configured to press the third block 110" (away) (from the first wall of the space) into the third position (along the third wall).

For example, the first block 110 may be located alongside the second 110' and third 110" blocks on the third wall. The first block 110 may adjoin the second block 110'. The first block 110 may adjoin the third block 110". The first 110, second 110' and third 110" blocks may be located between a fourth and a fifth wall of the space 130. The first 110, second 110' and third 110" blocks may be located on the third wall. The fourth and fifth walls may adjoin the first, second and third walls of the space 130. The space 130 may taper in a direction away from the first wall of the space 130. The fourth and fifth walls of the space 130 may be substantially parallel.

A surface area of the fourth wall may substantially coincide with a surface area of the fifth wall.

For example, a form of the first block may differ from a form of the second 110' or third block 110". A portion of the (first 110, second 110' or third 110") block that touches the foil may be flattened in order to minimize pressure on the foil.

For example, the first spring may be arranged on one side alongside the multiplicity of springs. The second spring may be arranged on another side alongside the multiplicity of springs.

For example, the multiplicity of springs may be located between the first spring and the second spring.

For example, the casing 100 may also comprise a release handle. The release handle may be connected to the first block 110. The release handle may be configured to move the first block 110 from the first position to the second position by the manual application of force. The release handle may be configured to move the first block 110 from the first position into the third position. The release handle may be configured to move the second block 110' and the third block 110" together with the first block 110 from the third position to the second position.

For example, the second 110' and third 110" blocks respectively may have a form closure. The form closure may be respectively configured to receive the first block 110, in order that the first, second 110' and third 110" blocks can move together from the third position to the first position (when the release handle is actuated). The form closure may be configured in the form of a web or an extension. The expression "form closure" may be understood here as meaning a mechanical contact.

For example, the release handle may be configured to connect the first block 110 to a third outer side of the casing 100.

For example, the release handle may be configured to displace the first block 110 (at least partially in the direction of the first wall and/or at least partially along the third wall) when the release handle is manually actuated.

For example, the first block 110 may be configured to move between the second 110' and third 110" blocks on the third wall.

Further details and aspects are mentioned in conjunction with the exemplary embodiments described above or below. The exemplary embodiment mentioned in FIG. 1 may have one or more optional additional features which correspond to one or more aspects that are mentioned in conjunction with the proposed concept or exemplary embodiments described below with reference to FIGS. 2-11.

Figure 2:
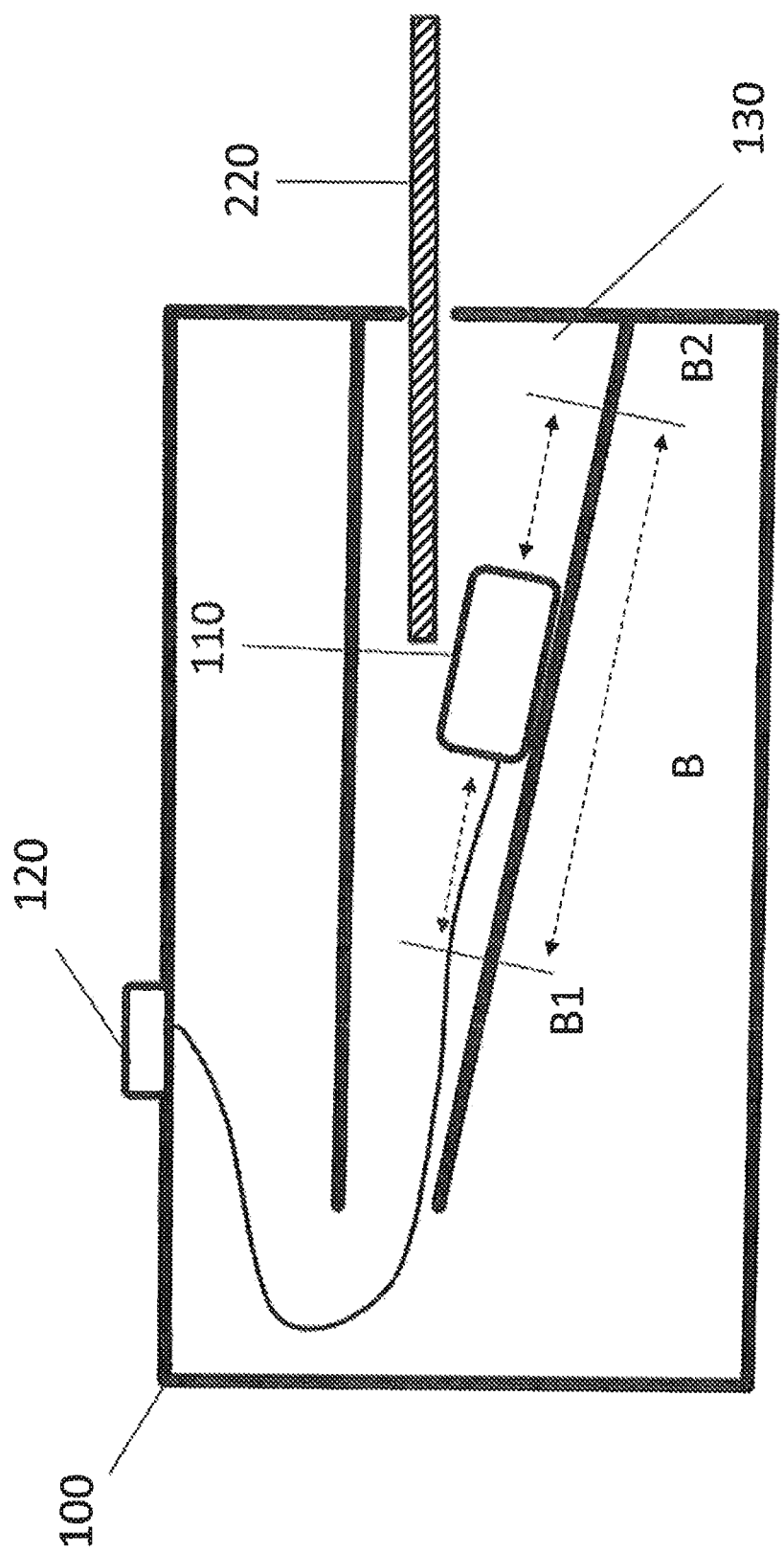
FIG. 2 shows a schematic representation of a casing and a foil provided with printed electrical lines.

FIG. 2 shows a schematic representation of a casing 100 and a foil 220 provided with printed electrical lines. The foil 220 provided with printed electrical lines is configured to be connected to a casing 100 according to the first aspect. For this, the foil 220 may, as shown on the right, be led through an opening of the casing 100. The opening leads into the space 130, which has an open or closed wall on an opposite side of the opening. When the foil 220 has been inserted, it can be secured by the block 110 on a top (upper wall) of the space 130 when the block is approximately at position B1. The lines on the foil 220 can consequently be connected by way of the block 110 to the terminal pads 120. A voltage conversion can thereby take place on the electrical connection drawn as a line. The range of movement B of the block can be given by the positions B1 and B2, which can be set by way of springs, the ends of which can be attached to the wall with the opening.

Further details and aspects are mentioned in conjunction with the exemplary embodiments described above or below. The exemplary embodiment shown in FIG. 2 may have one or more optional additional features, which correspond to one or more aspects that are mentioned in conjunction with the proposed concept or one or more exemplary embodiments described above (for example FIG. 1) or below (for example FIGS. 3-11).

Figure 3:
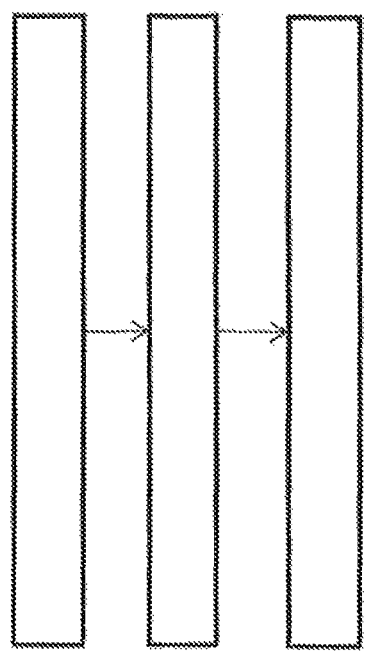
FIG. 3 shows a schematic representation of a method for connecting a foil provided with printed electrical lines to a casing.

FIG. 3 shows a schematic representation of a method for connecting a foil provided with printed electrical lines to a casing. The method comprises moving 5310 the release handle 840 from the first position B1 to the second position B2. The method also comprises inserting S5320 the foil 220 into the opening A. The method further comprises letting go S5330 of the release handle 840. The designations in FIG. 3 refer to the other figures.

Further details and aspects are mentioned in conjunction with the exemplary embodiments described above or below. The exemplary embodiment shown in FIG. 3 may have one or more optional additional features, which correspond to one or more aspects that are mentioned in conjunction with the proposed concept or one or more exemplary embodiments described above (for example FIGS. 1-2) or below (for example FIGS. 4-11).

Figure 4:
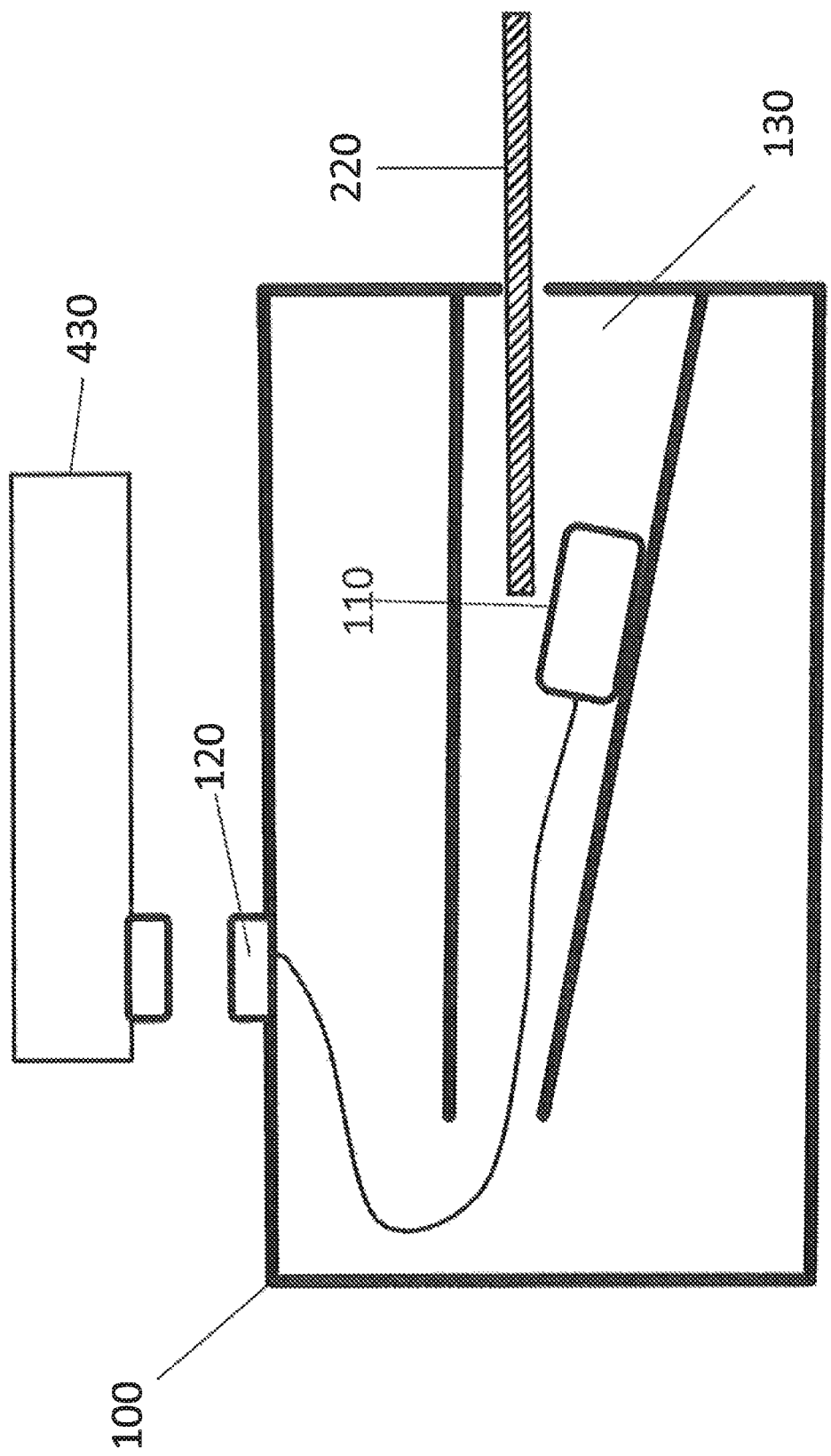
FIG. 4 shows a schematic representation of a casing and a voltage supply.

FIG. 4 shows a schematic representation of a casing 100 and a voltage supply 430. The voltage supply 430 is configured to be connected to the casing 100 according to the previous figures or subsequent figures. The casing 100 may be configured to establish a connection between the voltage supply 430 and the electrical lines of the foil 220. It may take place by way of a cable, as shown in FIG. 4 by a line. Instead of the cable, a voltage converter/voltage transformer may also be connected between respective terminal pads 120 and the block 110 or its respective electrical terminals (at or on the block 110). Here, for example, two cables may lead from the respective terminal pads 120 to the voltage transformer. The corresponding cables leading from the voltage transformer to the electrical terminals of the block 110 carry the potential corresponding to the terminal pads 120, so that a voltage difference can be passed on from in each case two terminal pads 120 to two electrical terminals of the block 110. The block 110 can then press the foil 220 against a top of the space, in order to establish an electrical connection between the lines on the foil 220 and the terminal pads 120. The terminal pads 120 may have pairs of terminal pads 120, where in each case one is a voltage potential and the other is an earth. It is conceivable for there to be any desired number of earths. For example, the voltage supply 430 may have four terminal pads (in FIG. 4 only one terminal pad is shown) of the voltage supply 430 corresponding to the terminal pads 120. As a result, for example, two voltages can be transmitted/transferred to the electrical lines of the foil 220.

For example, the voltage supply 430 may be provided in the form of a bus system. If the bus system 430 runs along one direction, for example in an aircraft along a skin of the aircraft, the opening of the casing into which the foil 220 is to be inserted may run in an orthogonal direction. For example, the voltage supply 430 may be attached to a skin of the aircraft, the voltage supply 430 being intended to be located between the skin and the casing 100. The casing can be connected to the voltage supply such that the lines of the bus system run substantially orthogonally in relation to the foil 220 passing through the opening.

Further details and aspects are mentioned in conjunction with the exemplary embodiments described above or below. The exemplary embodiment shown in FIG. 4 may have one or more optional additional features, which correspond to one or more aspects that are mentioned in conjunction with the proposed concept or one or more exemplary embodiments described above (for example FIGS. 1-3) or below (for example FIGS. 5-11).

Figure 5:
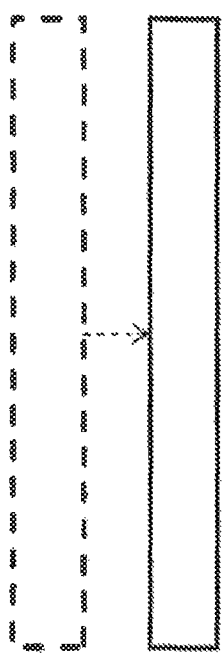
FIG. 5 shows a schematic representation of a method for connecting the voltage supply to a casing.

FIG. 5 shows a schematic representation of a method for connecting the voltage supply 430 to a casing 100. The method may comprise an aligning 5510 of the casing with the voltage supply 430. The aligning may comprise an aligning 5510 of the terminal pads of the casing with the terminal pads of the voltage supply 430. The method further comprises a connecting 5520 of the casing to the voltage supply. Here, the voltage supply may have rails into which the casing can be snapped.

Further details and aspects are mentioned in conjunction with the exemplary embodiments described above or below. The exemplary embodiment shown in FIG. 5 may have one or more optional additional features, which correspond to one or more aspects that are mentioned in conjunction with the proposed concept or one or more exemplary embodiments described above (for example FIGS. 1-4) or below (for example FIGS. 6-11).

Figure 6:
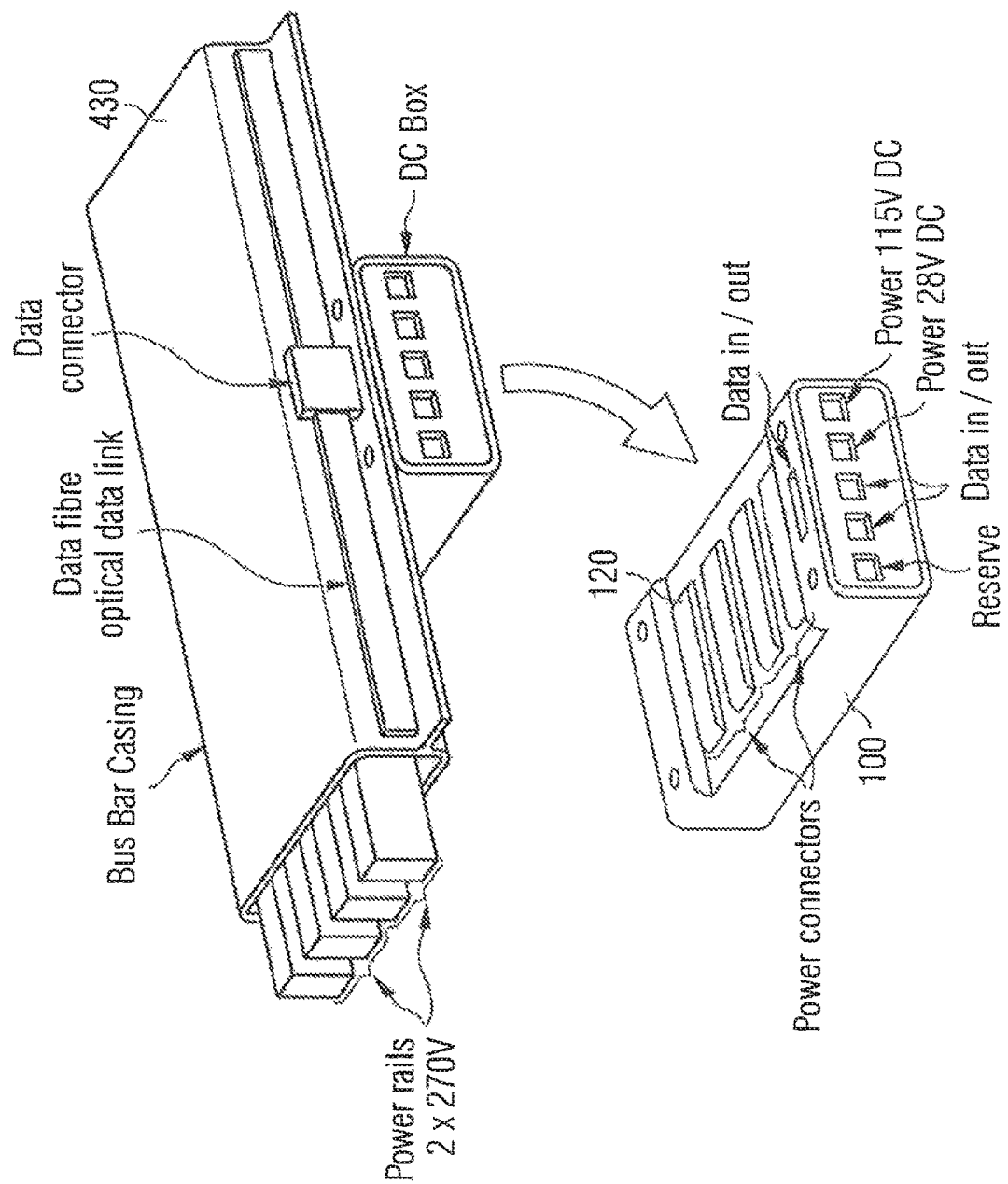
FIG. 6 shows a schematic representation of a bus system and a casing.

FIG. 6 shows a schematic representation of a bus system 430 and a casing 100. This representation may be a configuration of a bus system, also referred to herein as a bus bar (system), and a casing, also referred to herein as a DC box. An application for this configuration may be in an aircraft. The bus bar system may improve a power distribution to consumer units. An application for the bus bar system may be for short-haul aircraft fuselages. In FIG. 6, four bus bars (in the form of power rails) are shown by way of example. Two bars respectively present a voltage, here two times 270 volts. The bus bars are accommodated in a casing (bus bar casing). Furthermore, the bus bar system may comprise data lines, such as optical lines (data fiber, optical data link). The data transmission by way of the bus bar system can be taken or can take place by way of the data connector. The DC box 100 may be attached under the bus bar casing of the bus bar system 430. It has four corresponding terminals (power connectors) for the two bus bar pairs to be connected. The DC box 100 also has data inputs and outputs (data in/out) for connection to the data connector of the bus bar system 430. The DC box has two data outputs (data in/out), two voltage taps (115 volts and 28 volts) DC voltage and, for example, a spare for voltage or data.

For connecting foils, on which both lines and circuits may be located, to the bus bar system 430, the casing 100 may be interposed or serve as a terminal. The foils may be flexible.

Further details and aspects are mentioned in conjunction with the exemplary embodiments described above or below. The exemplary embodiment shown in FIG. 6 may have one or more optional additional features, which correspond to one or more aspects that are mentioned in conjunction with the proposed concept or one or more exemplary embodiments described above (for example FIGS. 1-5) or below (for example FIGS. 7-11).

Figure 7:
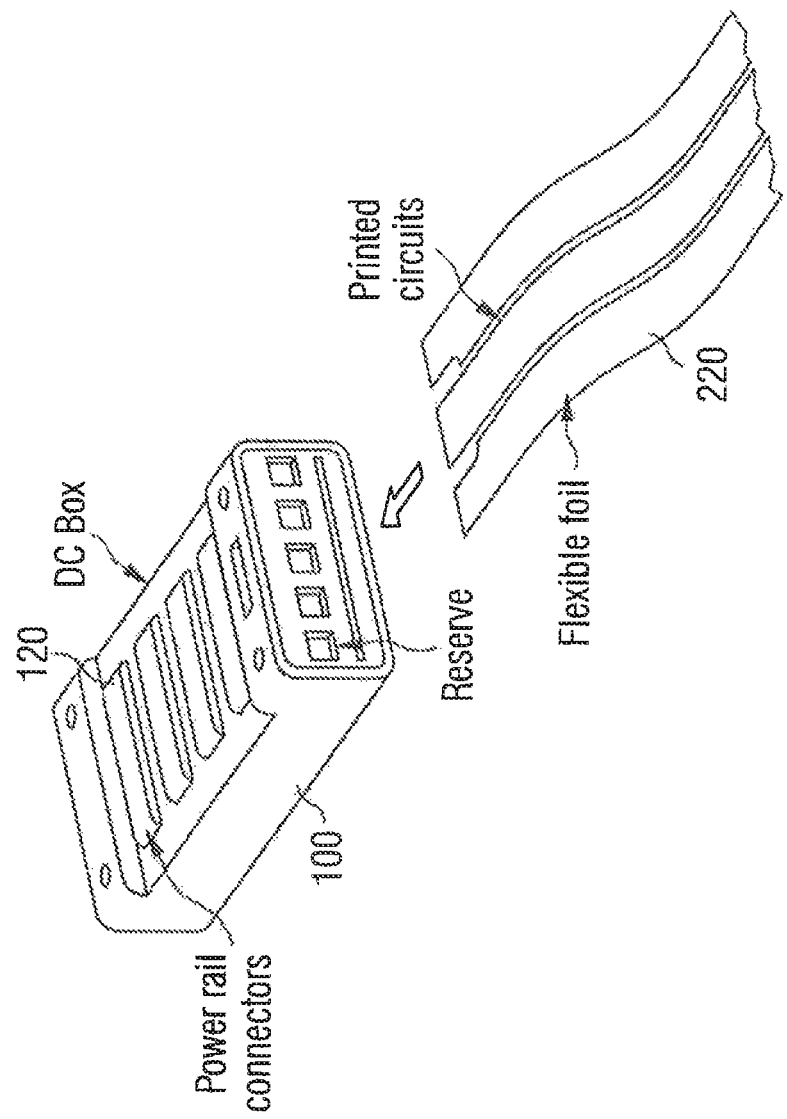
FIG. 7 shows a schematic representation of a casing and a flexible foil with printed lines.

FIG. 7 shows a representation of a casing 100 (DC box) and a flexible foil 220 with printed lines. For connecting to a voltage supply (bus bar), the DC box 100 has here an opening in the form of a slit. The foil 220, provided with printed circuits (printed electronics)/lines, can be inserted into this slit. This can be used for the "last meter" power and/or data transmission. Furthermore, the DC box 100 may have respective terminals for connection to the voltage supply and for a separate consumer unit, for example in the interior of an aircraft.

Further details and aspects are mentioned in conjunction with the exemplary embodiments described above or below. The exemplary embodiment shown in FIG. 7 may have one or more optional additional features, which correspond to one or more aspects that are mentioned in conjunction with the proposed concept or one or more exemplary embodiments described above (for example FIGS. 1-6) or below (for example FIGS. 8-11).

Figure 8:
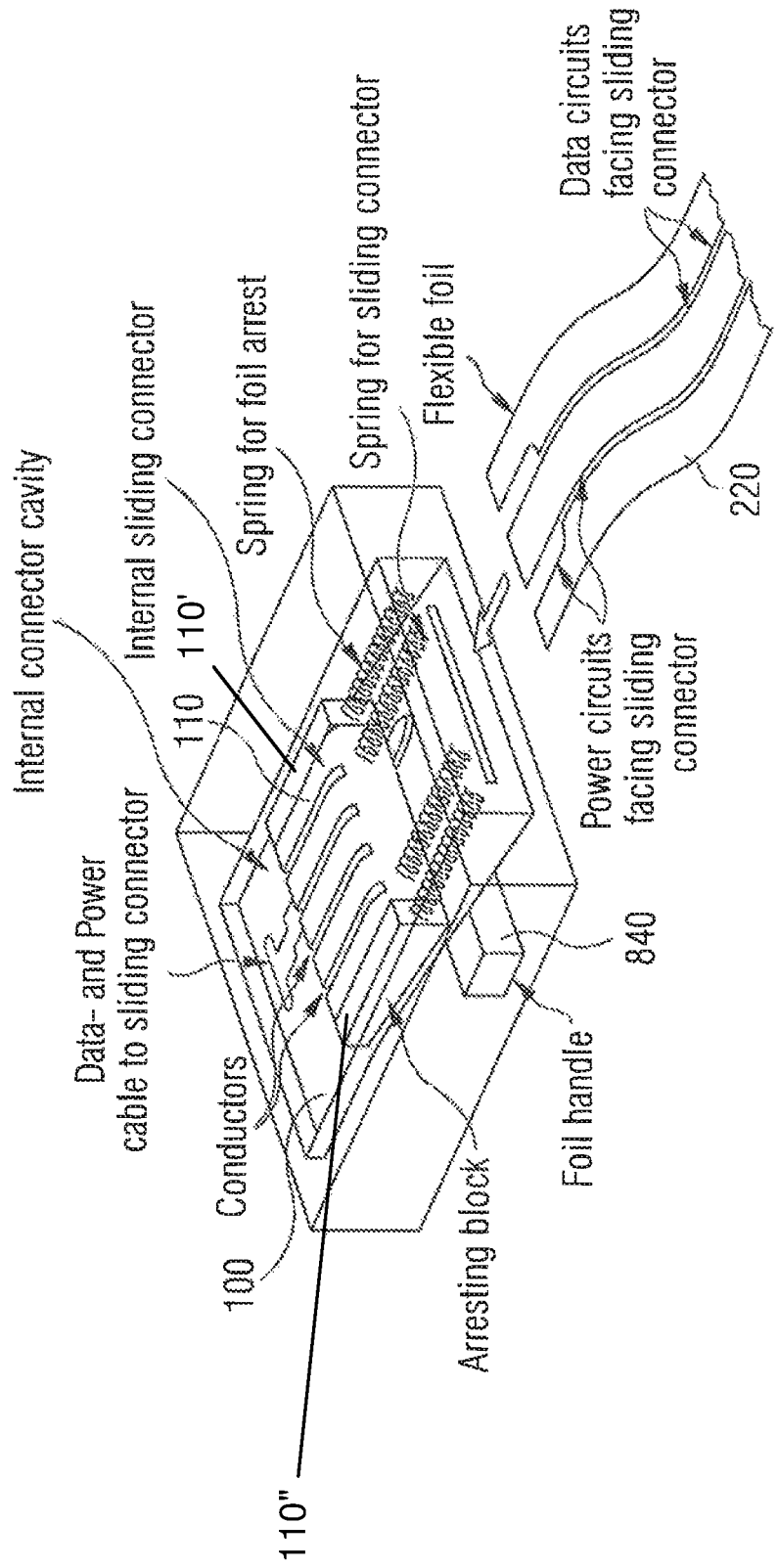
FIG. 8 shows a schematic representation of an internal structure of a casing.

FIG. 8 shows a schematic representation of an internal structure or an internal functionality of a casing 100. The internal hollow space in which the printed electrics foil 220 can be fully inserted can be seen here. In the hollow space, which has an angled bottom plane, a first block 110, which has on the upper side printed circuits that correspond to the printed circuits on the foil, can move in a sliding manner. This block 110 is spring-loaded, so that it is pressed without manual intervention into the rearmost position, at which it can rub against the inserted foil and in this way is able to slight oxide films, contaminants etc. (in a way similar to in the case of crimped pins (crimp pins)). At the sides of the block 110 there are two further "spring-loaded" foil arresting blocks 110', 110". These can also move rearwards without manual intervention, until they arrest the foil against the top of the hollow space. The foil arresting blocks 110', 110" have a structured surface on top for maximum friction.

Further details and aspects are mentioned in conjunction with the exemplary embodiments described above or below. The exemplary embodiment shown in FIG. 8 may have one or more optional additional features, which correspond to one or more aspects that are mentioned in conjunction with the proposed concept or one or more exemplary embodiments described above (for example FIGS. 1-7) or below (for example, FIGS. 9-11).

Figure 9:
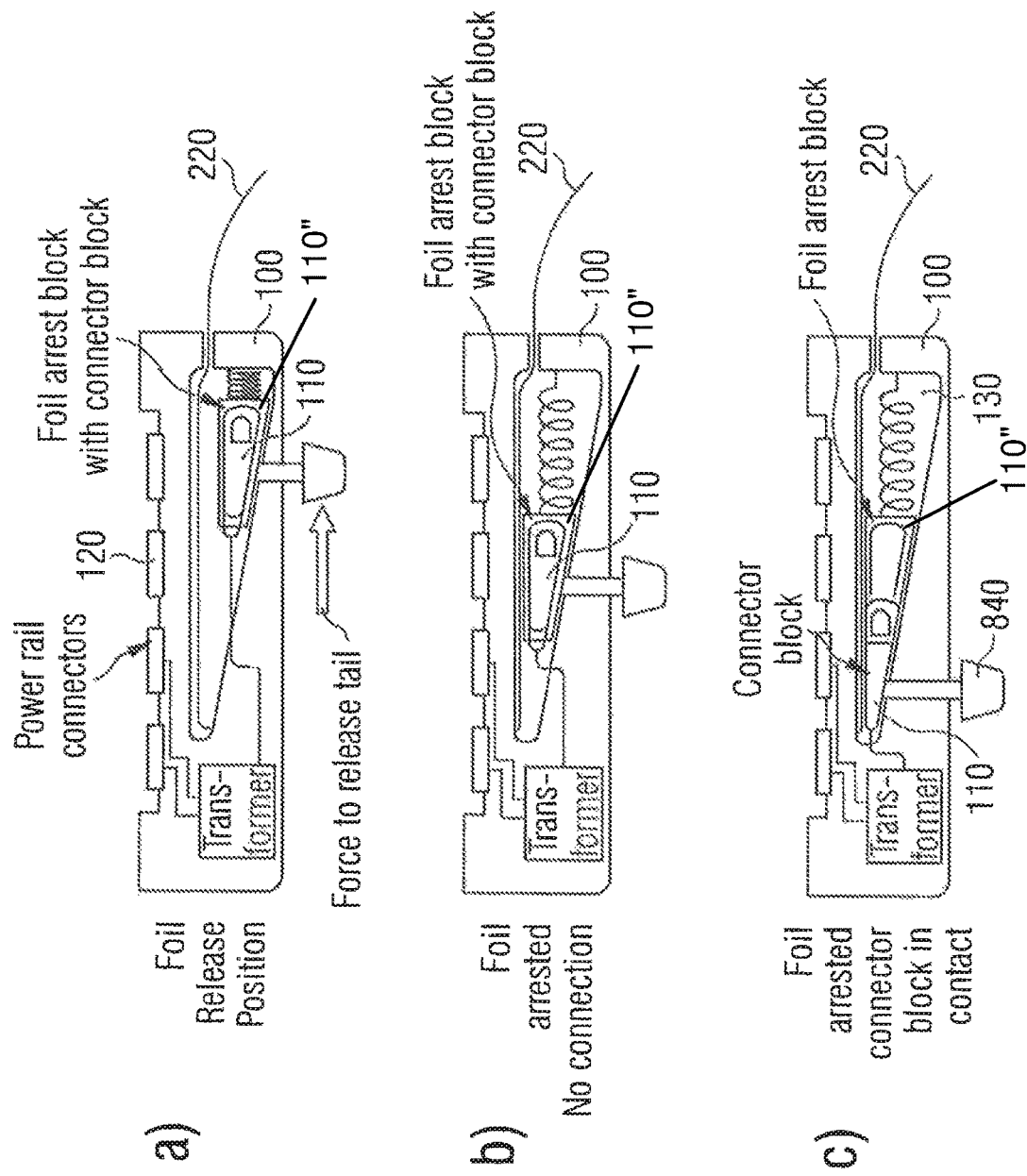
FIG. 9 shows a schematic representation of an operation for fastening a foil provided with electrical lines.

FIG. 9 shows a schematic representation of an operation for fastening a foil 220 provided with electrical lines. Here, a sequence for fastening the printed electrics foil within the DC box 100 for the bus bar is shown: foil release position (FIG. 9 (a)); foil arrested by foil arresting blocks 110', 110", no connection (FIG. 9 (b)); and foil arrested, block 110 in contact (FIG. 9 (c)). In (a), the foil is inserted up to the end of the space 130, while the release handle 840 under the DC box 100 is actuated in one direction. In (b), the release handle 840 is actuated in another direction. In the position shown, the foil arresting blocks 110', 110" have just arrested the foil. In this way it is ensured that the foil does not move any further as soon as the block 110 begins to rub against the foil. In (c), the block 110 has returned to its starting position (no force applied from outside). The starting position is the rearmost position, to which the block 110 returns, and is arrested there, by either pressing against the top of the space 130 when no foil 220 is present, or by the foil 220 pressing against the top of the space 130 when the foil 220 is present. In this way, a situation similar to a form closure can be achieved. If the foil is to be released, the release handle 840 must be actuated, and, when it is pressed (to the right) into the "release" position, the block 110 will first release the electrical terminal of the foil 220. The block 110 (is fastened to the release handle 840) then moves towards the foil arresting blocks 110', 110" (or partially into the foil arresting block/blocks) and then moves together with the foil arresting blocks 110', 110" until the foil can be pulled out. A voltage transformer, which transforms the high voltage from the bus bar (for example 270 V) to a final consumer voltage (115 V or 28 V), is located on the left in the interior of the DC box 100.

Further details and aspects are mentioned in conjunction with the exemplary embodiments described above or below. The exemplary embodiment shown in FIG. 9 may have one or more optional additional features, which correspond to one or more aspects that are mentioned in conjunction with the proposed concept or one or more exemplary embodiments described above (for example, FIGS. 1-8) or below (for example FIGS. 10-11)

Figure 10:
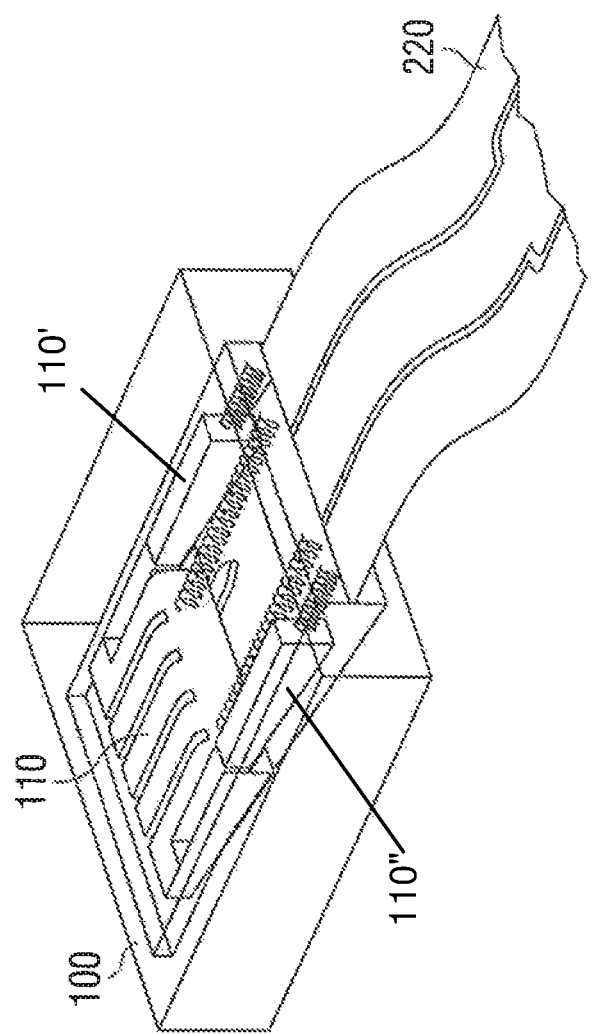
FIG. 10 shows a schematic representation of a casing with a first, second and third block for fastening a foil provided with electrical lines.

FIG. 10 shows a schematic representation of a casing 100 with a first 110, second 110' and third 110" block for fastening a foil provided with electrical lines. Shown here to the sides of the first block 110 are the foil arresting blocks 110', 110", which arrest the foil against a top of the space of the casing. The pairs of electrical lines used for the voltage transmission (here two pairs) can also be seen in FIG. 10. Here, a spring is respectively attached to the foil arresting blocks 110', 110" and two springs are respectively attached to the first block 110, in order to generate a restoring force for securing the foil. The springs are in each case attached by one end to the same wall of the space and by the other end to their corresponding block.

Further details and aspects are mentioned in conjunction with the exemplary embodiments described above or below. The exemplary embodiment shown in FIG. 10 may have one or more optional additional features, which correspond to one or more aspects that are mentioned in conjunction with the proposed concept or one or more exemplary embodiments described above (for example, FIGS. 1-9) or below (for example, FIG. 11).

Figure 11:
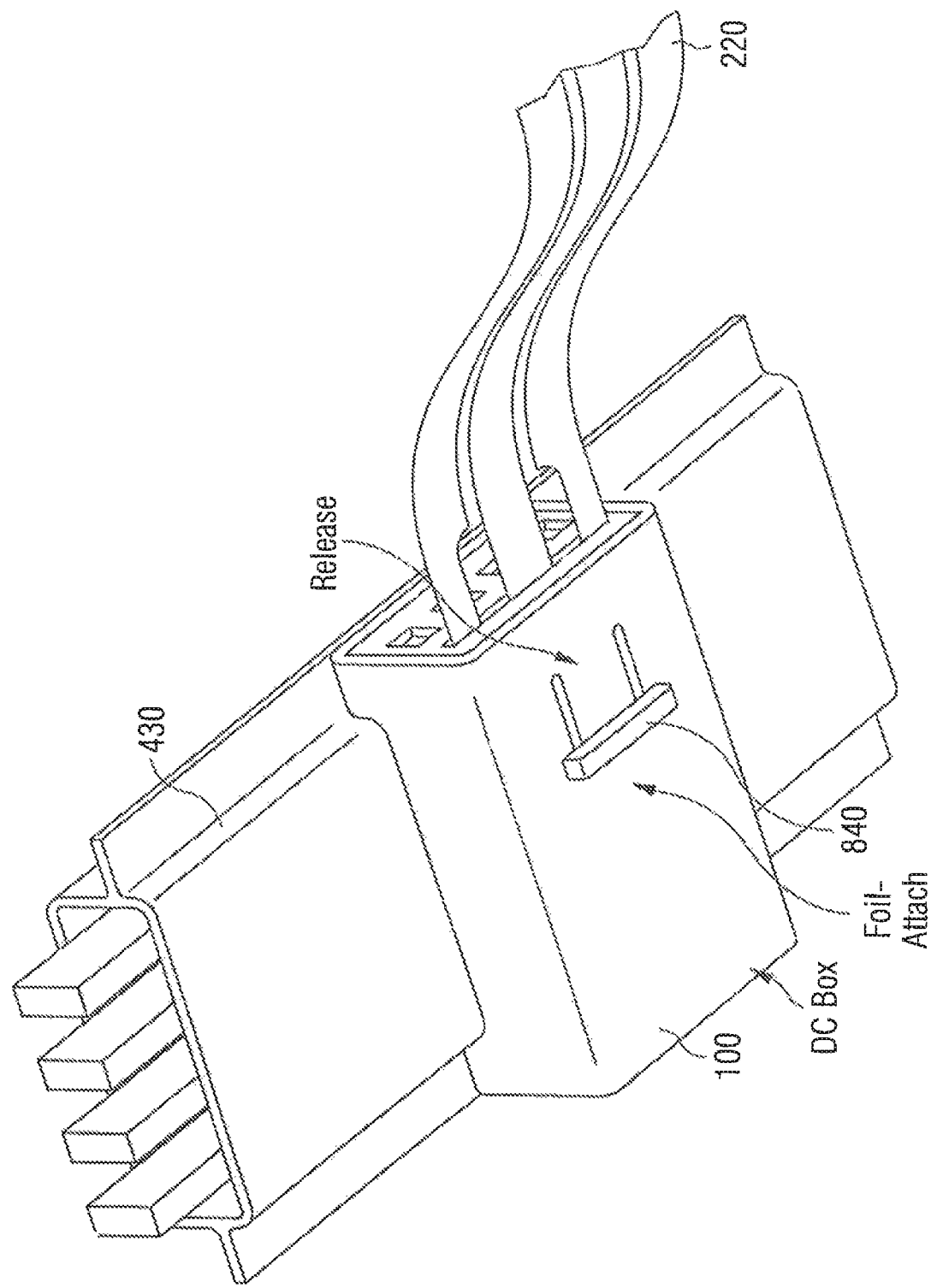
FIG. 11 shows a schematic representation of an attachment of a casing to a bus system.

FIG. 11 shows a schematic representation of an attachment of a casing 100 (DC box) to a bus system 430 (bus bar).

The DC box 100 is connected under the bus bar 430, while a foil 220 can be connected to the DC box 100. The release handle 840 can also be seen.

Further details and aspects are mentioned in conjunction with the exemplary embodiments described above or below. The exemplary embodiment shown in FIG. 11 may have one or more optional additional features, which correspond to one or more aspects that are mentioned in conjunction with the proposed concept or one or more exemplary embodiments described above (for example, FIGS. 1-10) or below.

According to one aspect, there may be fewer and more orderly placed power cables. Furthermore, less electrical losses may occur than in the case of thin cables. The casing 100 may be attached at regular distances along an aircraft fuselage in order to provide a power supply (in the form of stepped-down DC). These regular distances may be for example every 1 m, 2 m, or 3 m.

According to one aspect, a DC box for use with a bus bar may provide a direct connection for printed electronics/electrics foils. Furthermore, a print-similar electrical connection of the foil may be provided. Furthermore, a secure clamping of the foil and also a simple attaching and releasing mechanism may be provided.

According to one aspect, a bus bar DC box with an integrated printed electronics foil connector may be provided. Furthermore, printed electrics, printed flexible foils, electrical bus bars and a DC box may be provided.

According to one aspect, a foil may be attached in a print-like/print-similar manner, in order to establish an electrical connection.

According to one aspect, the casing may be easily fastened to the bus bar.

According to one aspect, the casing may provide a direct plug-in location for printed electrics foils for "last meter" distribution.

According to one aspect, the printed electrics foil may be easily attached and easily detached by a simple release device/release bar.

According to one aspect, the casing may provide a stepped-down voltage.

According to one aspect, the casing may provide further connection possibilities for standard connectors.

According to one aspect, a bus bar for example for high-voltage transmission and/or optical glass fiber networks may be provided.

According to one aspect, a method for connecting the DC box to the bus bar may be provided, for inserting a printed electrics foil by manually moving the release bar (in one direction: moving, in the other direction: letting go). Letting go allows the foil to be arrested (for example by spring force).

The aspects and features which have been mentioned and described together with one or more of the examples and figures described in detail above may also be combined with one or more of the other examples to substitute a similar feature of the other example or to introduce the feature additionally into the other example.

Examples may also be or relate to a computer program with a program code for carrying out one of the above methods when the computer program is executed on a computer or processor. Steps, operations or processes of various methods described above may be carried out by programmed computers. Examples may also cover program storage devices, for example digital data storage media, which are machine-, processor- or computer-readable and code machine-executable, processor-executable or computer-executable programs of instructions. The instructions carry out some or all of the steps of the methods described above or instigate carrying them out. The program storage devices may be for example digital stores, magnetic storage media, such as for example magnetic disks and magnetic tapes, hard disk drives or optically readable digital data storage media. Also, further examples are intended to cover computers, processors or control units programmed for carrying out the steps of the methods described above or (field-) programmable logic arrays ((F)PLA) or (field-) programmable gate arrays ((F)PGA) programmed for carrying out the steps of the methods described above.

The description and drawings only represent the principles of the disclosure. Furthermore, all of the examples presented here are expressly intended only to serve for teaching purposes, in order to assist the reader in understanding the principles of the disclosure and the concepts contributed by the inventor(s) for the further development of the technology. All statements made here concerning principles, aspects and examples of the disclosure as well as particular exemplary embodiments of the same are intended to comprise equivalents thereof.

A block diagram may for example represent a detailed circuit diagram that implements the principles of the disclosure. In a similar way, a sequence diagram, flow diagram, state transition diagram, pseudocode and the like may represent various processes which are substantially represented in a computer-readable medium and thus can be executed by a computer or processor, irrespective of whether such a computer or processor is expressly represented. Methods disclosed in the description or in the claims may be implemented by a device that has means for executing each of the corresponding steps of these methods.

Furthermore, it goes without saying that the disclosure of multiple steps, processes, operations, sequences or functions disclosed in the description or the claims should not be interpreted as being in the specific sequence, unless this is explicitly or implicitly stated otherwise, for example for technical reasons. The disclosure of a number of steps or functions therefore does not restrict them to a specific sequence, unless these steps or functions are not interchangeable for technical reasons. Furthermore, in some examples a single step, a function, a process or a sequence may include a number of partial steps, functions, processes or sequences or be broken up into them. Such partial steps may be included and be part of the disclosure of this single step, unless they are expressly excluded.

Furthermore, the following claims are hereby included in the detailed description, where each claim can stand for itself as a separate example. If each claim can stand for itself as a separate example, it should be noted that—although a dependent claim in the claims can relate to one particular combination with one or more other claims—other exemplary embodiments may also include a combination of the dependent claim with the subject matter of each other dependent or independent claim. Unless it is stated that a specific combination is not intended, these combinations are proposed here.

The present disclosure is of course not restricted in any way to the embodiments described above. On the contrary, many possibilities for modifications thereof will be evident to an average person skilled in the art without departing from the fundamental idea of the present disclosure as it is defined in the appended claims.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for connecting a foil provided with printed electrical lines to a casing, the casing comprising:
   a space, wherein the casing has an opening between a first wall of the space and a first outer side of the casing;
   terminal pads, which are at least partially arranged on a second outer side of the casing, and
   a first block, which is configured to move between a first position within the space and a second position within the space,
   wherein the first block is configured to press the foil against a second wall of the space and to establish an electrical connection between the electrical lines printed on the foil and the terminal pads when the block is in the first position, and
   wherein the space is configured to receive the foil through the opening when the block is in the second position, the method comprising:
   moving a release handle from the first position to the second position;
   inserting the foil into the opening; and
   letting go of the release handle.

2. A casing for connecting electrical lines printed on a foil to a voltage supply, the casing comprising:
   a space, wherein the casing has an opening between a first wall of the space and a first outer side of the casing;
   terminal pads, which are at least partially arranged on a second outer side of the casing, and
   a first block, which is configured to move between a first position within the space and a second position within the space,
   at least one second block, wherein the first block is located adjacent to the second block, and wherein the second block is configured to move between the second position and a third position, and to press the foil against the second wall when the second block is in the third position, and wherein the third position is located between the first and second positions
   wherein the first block is configured to press the foil against a second wall of the space and to establish an electrical connection between the electrical lines printed on the foil and the terminal pads when the block is in the first position, and
   wherein the space is configured to receive the foil through the opening when the block is in the second position.

3. The casing according to claim 2, wherein the casing comprises a voltage transformer, which is connected between the terminal pads and the block and is configured to transform a first voltage, applied to the terminal pad, to a second voltage, applied to the block, in order to establish the electrical connection between the electrical lines printed on the foil and the terminal pads.

4. The casing according to claim 3, wherein the voltage transformer is located outside the space, and wherein the voltage transformer is located inside the casing.

5. The casing according to claim 2, wherein the first and second positions are located on a third wall of the space, which lies opposite the second wall, and wherein the first and third walls of the space include an angle of less than 80°.

6. The casing according to claim 2, also comprising a multiplicity of springs, wherein a respective end of each spring of the multiplicity of springs is attached to the first wall of the space, wherein each of the multiplicity of springs is configured to press the first block into the first position.

7. A foil provided with printed electrical lines, which is configured to connect to a casing according to claim 2.

8. A voltage supply, configured to connect to the casing according to claim 2.

9. The casing according to claim 2, wherein the at least one second block comprises a second and a third block, wherein the first block is located between the second and third blocks, and wherein the second and third blocks are configured to move between the second position and the third position, and to press the foil against the second wall when the second and third blocks are in the third position.

10. A casing for connecting electrical lines printed on a foil to a voltage supply, the casing comprising:
a space, wherein the casing has an opening between a first wall of the space and a first outer side of the casing;
terminal pads, which are at least partially arranged on a second outer side of the casing,
a first block, which is configured to move between a first position within the space and a second position within the space, and
at least one spring, wherein an end of each spring of the at least one spring is attached to the first wall of the space, wherein each of the at least one spring is configured to press the first block into the first position,
wherein the first block is configured to press the foil against a second wall of the space and to establish an electrical connection between the electrical lines printed on the foil and the terminal pads when the block is in the first position, and
wherein the space is configured to receive the foil through the opening when the block is in the second position.

11. The casing according to claim 10, wherein the casing also comprises a second and a third block, wherein the first block is located between the second and third blocks, and wherein the second and third blocks are configured to move between the second position and a third position, and to press the foil against the second wall when the second and third blocks are in the third position, and wherein the third position is located between the first and second positions.

12. The casing according to claim 10, wherein the at least one spring comprises a multiplicity of springs, wherein a respective end of each spring of the multiplicity of springs is attached to the first wall of the space, wherein each of the multiplicity of springs is configured to press the first block into the first position.

13. The casing according to claim 10, wherein the casing comprises a voltage transformer, which is connected between the terminal pads and the block and is configured to transform a first voltage, applied to the terminal pad, to a second voltage, applied to the block, in order to establish the electrical connection between the electrical lines printed on the foil and the terminal pads.

14. The casing according to claim 13, wherein the voltage transformer is located outside the space, and wherein the voltage transformer is located inside the casing.

* * * * *